United States Patent
Huber et al.

(10) Patent No.: US 6,216,046 B1
(45) Date of Patent: Apr. 10, 2001

(54) METHOD FOR CONTROLLING SUCCESSIVE MACHINE PROCESSES

(75) Inventors: Wolfgang Huber, Munich; Gerhard Haas, Oberschleissheim; Martin Pruefer, Munich, all of (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/210,508

(22) Filed: Dec. 11, 1998

(30) Foreign Application Priority Data

Sep. 30, 1998 (DE) .............................................. 198 45 110

(51) Int. Cl.[7] ...................................................... G05B 19/18
(52) U.S. Cl. .......................... 700/3; 700/2; 700/9; 700/95
(58) Field of Search .............................. 700/2, 31, 9, 95, 700/100, 102, 112, 169, 121, 113

(56) References Cited

U.S. PATENT DOCUMENTS

| | | | |
|---|---|---|---|
| 4,027,246 | * | 5/1977 | Caccoma et al. ...................... 29/563 |
| 5,231,585 | * | 7/1993 | Kobayashi et al. ...................... 700/2 |
| 5,584,118 | | 12/1996 | Furukawa et al. ...................... 29/701 |
| 5,696,689 | * | 12/1997 | Okumura et al. ...................... 700/121 |
| 5,867,388 | * | 2/1999 | Okumura et al. ...................... 700/113 |
| 6,000,830 | * | 12/1999 | Asano et al. .......................... 700/121 |

* cited by examiner

*Primary Examiner*—William Grant
*Assistant Examiner*—Kipest Bahta
(74) *Attorney, Agent, or Firm*—Schiff Hardin & Waite

(57) ABSTRACT

In a conventional method for controlling successive machine processes, a central control unit only communicates the start commands to the individual decentralized control units when the decentralized control unit responsible for a previous machine process has communicated an end message to the central control unit. As a result of overloading the central control unit with other, a time delay arises between the individual process steps. In the method disclosed herein, the central control unit communicates a preparatory command for a second machine process to the decentralized second control unit during the execution of a first machine process together with a start condition. The second machine process is only started when the second control unit receives a completion signal directly from the first control unit to satisfy the start condition.

4 Claims, 3 Drawing Sheets

METHOD FOR CONTROLLING SUCCESSIVE MACHINE PROCESSES

BACKGROUND OF THE INVENTION

1. Field of the Invention

The present invention is directed to a method for controlling successive machine processes, wherein at least first and second decentralized process control units for different machine processes are connected to one another and to a central control unit.

2. Description of the Prior Art

Such successive machine processes play a part, for example, in the automatic equipping of substrates (such as printed circuit boards or ceramic substrates) with components such as SMD (surface mounted device) components or BGA (ball-grid arrays). The individual components are taken from a magazine or a delivery device with an equipping head and are then positioned in a predetermined position on the substrate.

In this process execution, a large number (approximately 20–30 per component) of successive machine processes are implemented, many of these only being allowed to be implemented if the machine process sequencing earlier in time was successfully completed. Such process sequences also occur in further automatic processing units required in the equipping process such as, for example, for applying glue points onto substrates. For monitoring this compulsory sequence of the machine processes, the individual control units that control and monitor the individual decentralized machine processes are connected to a central control unit that monitors the entire process execution. Each individual control unit communicates the end of the machine process which it controls to it to the central control unit, and the central control unit subsequently communicates a start command to the control unit responsible for the following machine process. Since, however, the central control unit controls a number of machine processes sequencing in parallel, and sequences additional tasks such as, for example, communication with an operator of the automatic equipping unit, time delays between the reception of the end signal from a first decentralized control unit and the output of the start command to a second decentralized control unit occur. Given a large number of successive machine processes, considerable losses of time, and thus equipping performances that are too low, arise. In addition, the communication between the decentralized control units and the central control unit occupies takes time that reduces the equipping performance.

One possibility for shortening the time would be to provide different central control units for different tasks, for example one central control unit controls tasks an additional central control unit for communication between the operator and the machine and for data editing. Communication among the various central control units, as would be necessary in such an approach, however, would still require an undesirable time expenditure.

SUMMARY OF THE INVENTION

An object of the present invention is to provide a method for the above type of process control The above object is achieved in accordance with the principles of the present invention in a method for controlling successive decentralized machine processes, each decentralized machine process having a decentralized control unit responsible for controlling that process, wherein a central control unit transmits a start command for a first of the decentralized machine processes to a first decentralized control unit, the first decentralized control unit starts the first decentralized machine process and transmits a start signal to the central control unit, during the execution of the first decentralized machine process, the central control unit transmits a preparatory command to a second decentralized control unit which is responsible for controlling a second of the decentralized machine processes. The preparatory command includes at least one start condition for the second decentralized machine process which is satisfied upon reception of a completion signal by the second decentralized control unit from the first decentralized control unit, indicating completion of the first decentralized process. The second decentralized control unit then starts the second decentralized machine process after reception of the aforementioned completion signal.

In the inventive method, one or more decentralized control units for successive machine processes are informed of the completion of the preceding machine process as by the decentralized control unit which is responsive for that preceding machine process, the reception of this completion signal being a part of the start condition. Without a detour via the central control unit, the decentralized control units exchange the satisfaction of these start conditions with one another. The central control unit distributes its commands—given the assumption of undisturbed execution—early enough so that they are present in the respective decentralized control unit before the start conditions are met. The delay is then defined only by the transmission between the individual decentralized control units and is correspondingly short.

As a result of the concentration of various jobs (control and operation) in a central control unit (and thus in a computer), which is enabled without loss of time as a result of the invention, costs for the hardware as well as for the software are saved. Only one central control unit, is employed, for which only one standard operating system is used.

A number of start conditions can be communicated to a simple decentralized control unit. As a result, a machine process which requires a number of machine processes be successfully executed before it can begin executing can be taken into consideration in the overall control procedure.

A flow chart for the machine processes can be stored in the central control unit, with the central control unit logging the proper execution on the basis of answerbacks by the decentralized control units. As a result, the central control unit is able to initiate an error routine given the occurrence and recognition of errors in the process execution.

The inventive method can be especially simply implemented in an embodiment wherein the central control unit and the decentralized control units are connected to one another by a bus capable of multi-address calling. A bus capable of multi-address calling has the property that each periphery device (control unit) connected thereto monitors the communication which is ensuing on the bus, but evaluates only the signals and commands which are relevant to that control unit. The signals and commands thus need not be transmitted multiply, but only once.

DESCRIPTION OF THE PREFERRED EMBODIMENTS

Figure 3A:
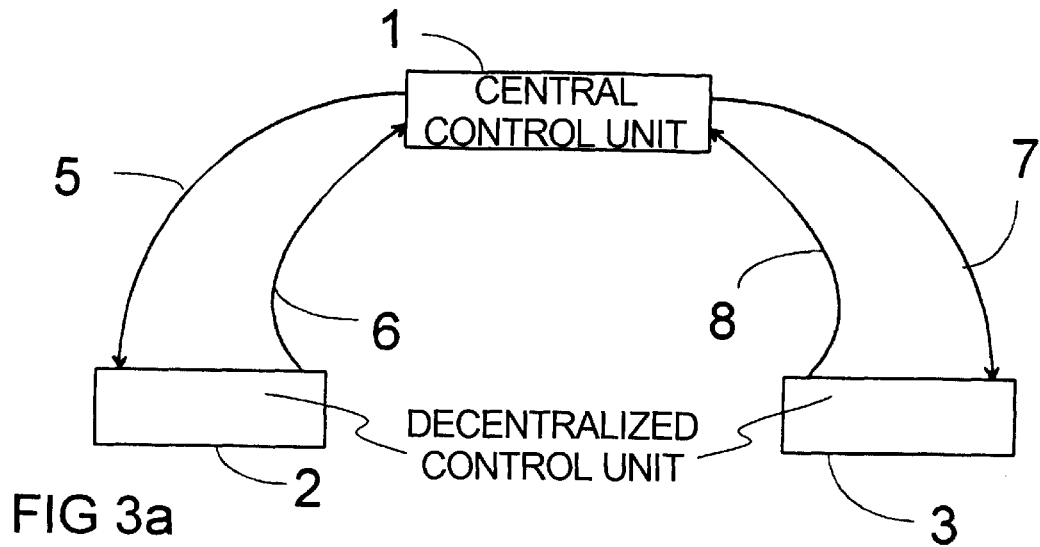
FIG. 3a schematically illustrates the operation of a control system without an operating unit.
Figure 4:
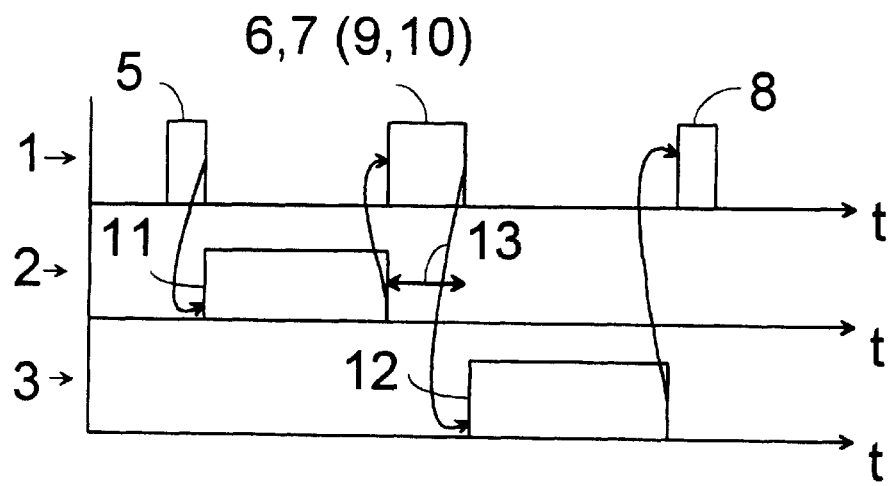
FIG. 4 schematically illustrates a sequential execution of a conventional control procedure.

FIG. 3a shows the operation of a conventional control system and FIG. 4a shows the appertaining time execution for controlling a number of successive machine processes. A central 1 control unit is connected to a first decentralized control unit 2 and a second decentralized control unit 3 that respectively sequence decentralized machine processes. Successive machine processes, in the context of an equipping process as an example, can be the approach to a pick-up position by the equipping head, the lowering of the suction pipette to pick up a component, the raising of the suction pipette, the rotation of the equipping head, the registration of the component with a camera, the approach to the predetermined position for the component on the substrate, the lowering of the suction pipette toward the substrate, the interruption of the suction (to release the components), and the raising of the suction pipette. These processes are presented herein only as an example. Arbitrary other machine processes, with which a person skilled in the art is familiar, are likewise able to be coupled to one another by the inventive method during equipping or when placing glue points as well. The inventive method is also suitable for other automation processes with which the person skilled in the art is familiar.

Conventionally, the process then sequences as follows (FIG. 3a, FIG. 4):

The central control unit 1 communicates a start command 5 for the first decentralized machine process 11 to the first decentralized control unit 2; the first decentralized control unit 2 sequences the first decentralized machine process 11; after the end of the first decentralized machine process 11, the first decentralized control unit 2 communicates an end message 6 to the central control unit 1. After receiving the end message 6, the central control unit 1 sends a start command 7 for the second decentralized machine process 12 to the second decentralized control unit 3, which sequences the second decentralized machine process 12 and sends an end message 8 to the central control unit 1 after the execution. This method can be arbitrarily continued until the entire process execution has been completely sequenced. As a result of the repeated communications via the central control unit 1, an undesired time delay 13 arises between the end of the first decentralized machine process and the start of the second decentralized machine process 12. Due to the transit times of the signals between the decentralized control units 2 and 3 and the central control unit 1, further undesired losses of time occur.

Figure 3B:
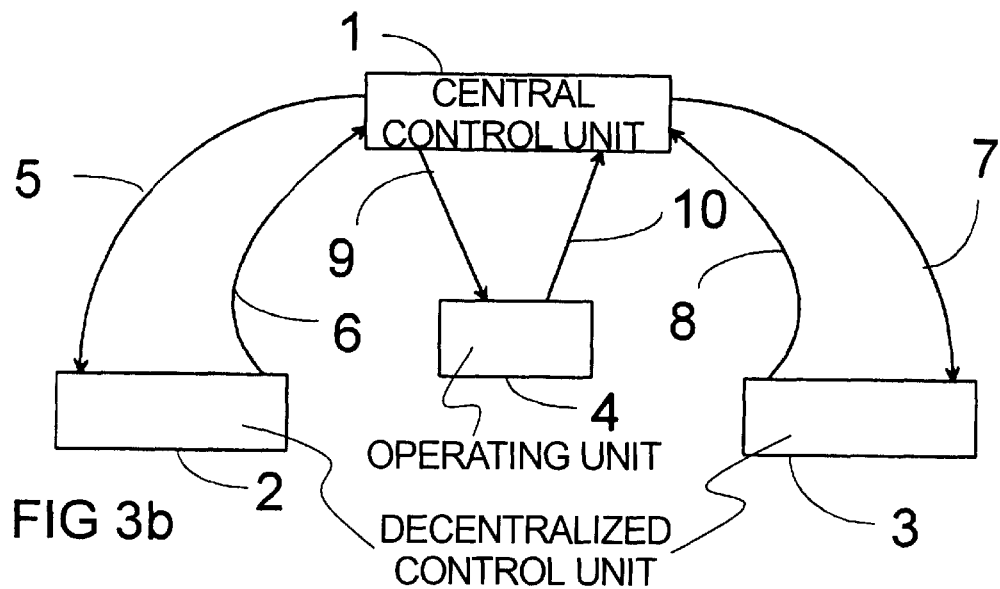
FIG. 3b schematically illustrates the operation of a conventional control with an operating unit.

As shown in FIG. 3b, the central control unit 1 often additionally communicates with further peripheral units such as, for example, an operating unit 4 via which an operator can intervene into the process execution or via which the process data are visualized for the operator. The start commands 9 and end of messages 10 for the operating process disturb the aforementioned control of the control units 2 and 3 and if the central control unit 1 must additionally sequence an operating process, a further undesired time delay 13—compared to the first example—occurs between the end of the first decentralized machine process 11 and the start of the second decentralized machine process 12.

Figure 1:
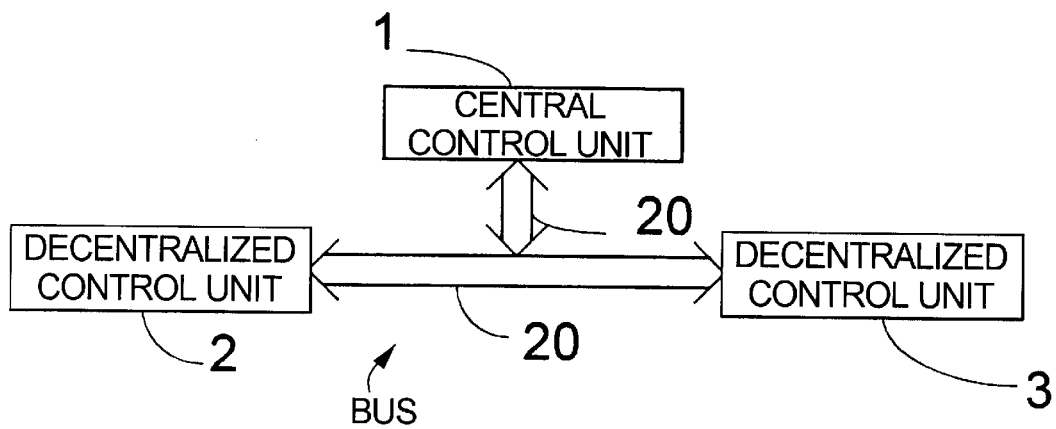
FIG. 1 is a block diagram showing the inventive connection of decentralized control units and a central control unit for practicing the inventive method.
Figure 2:
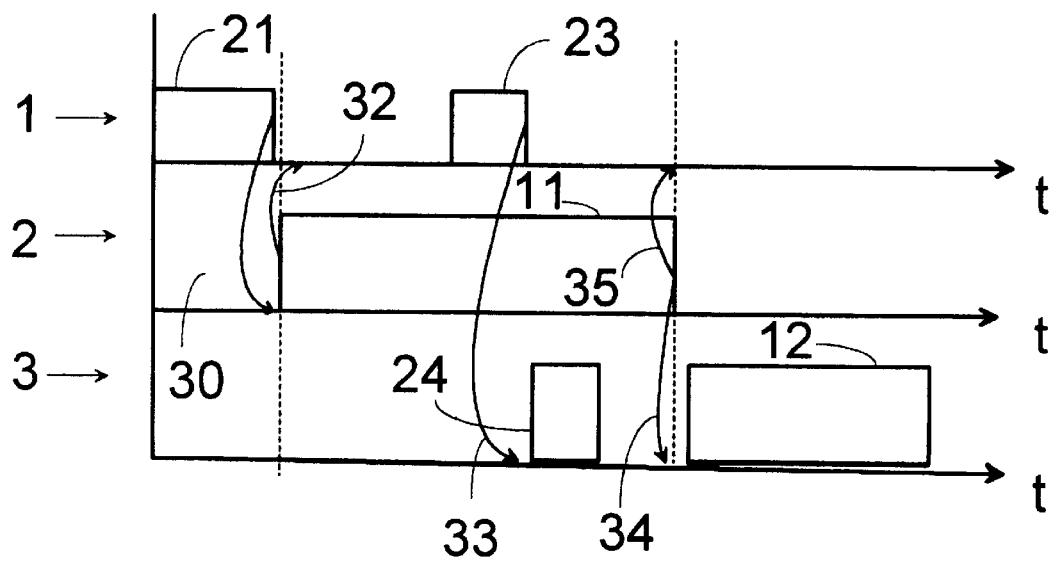
FIG. 2 schematically illustrates a sequential execution of the inventive method.
Figure 5:
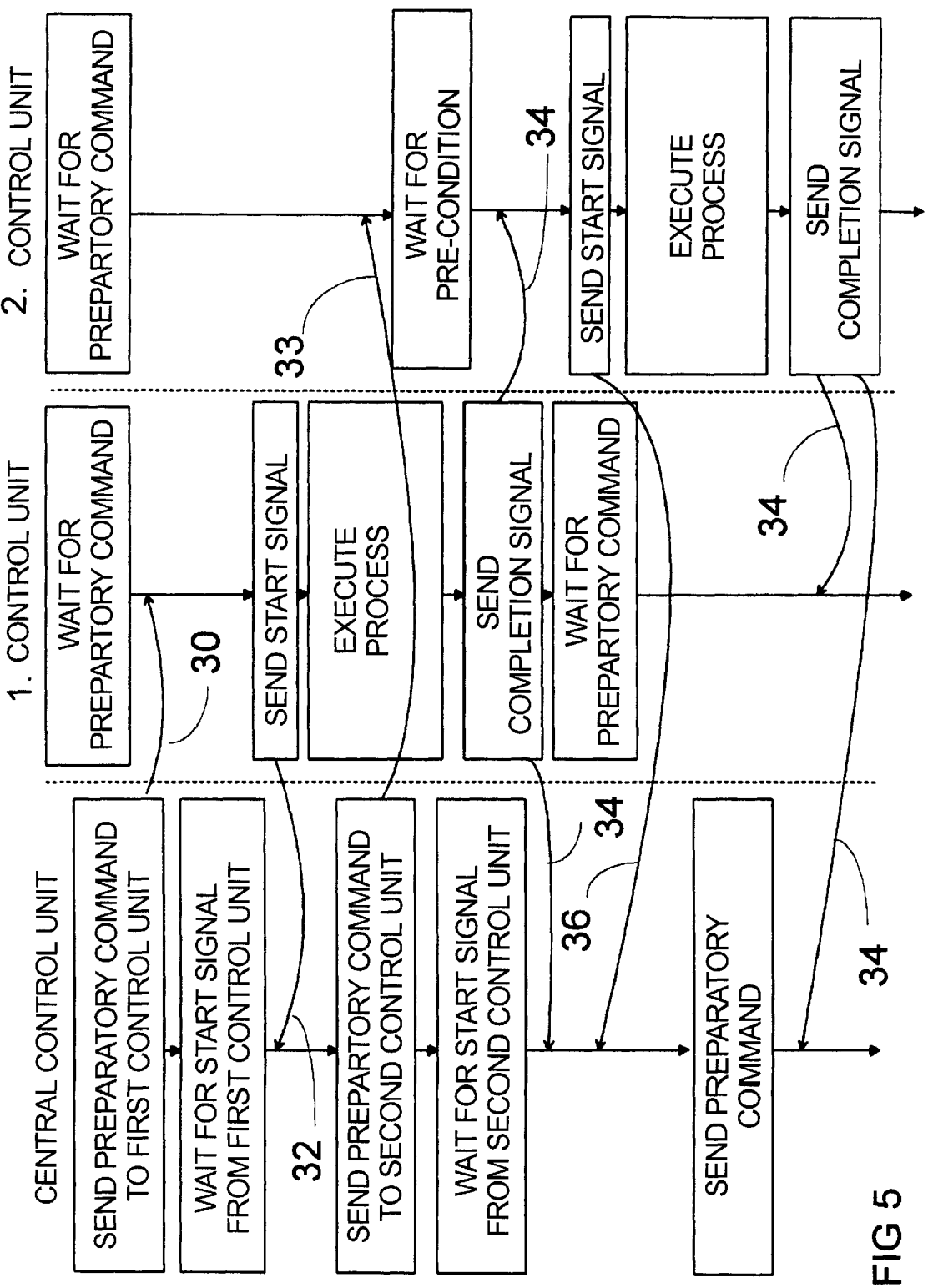
FIG. 5 is a flowchart of the inventive method.

The inventive method is shown in FIGS. 1 and 2 as well as in the flow chart of FIG. 5. The central control unit 1 and the decentralized control units 2 and 3 are connected to one another via a bus 20 capable of multi-address calling.

At the start of the process execution, the central control unit 1 communicates a preparatory command 30 to the first decentralized control unit 2. Subsequently, the first decentralized machine process 11 is implemented. The start of the first decentralized machine process 11 is communicated to the central control unit 1 with a start signal 32. During the running time of the first decentralized machine process 11, the central control unit 1 communicates a preparatory command 23, 33 to the second decentralized control unit 3. The received preparatory command 24 does not lead immediately to the implementation of the second decentralized machine process 12, but contains a start condition. After the execution of the first decentralized machine process 11, the first decentralized control unit 2 communicates a completion signal 34 directly to the second decentralized control unit 3, so that the start condition thereof is met. Subsequently, the second decentralized control unit 3 starts the second decentralized machine process 12.

This method can also be expanded to a number of machine processes. A number of start conditions can be communicated to the second decentralized control unit 3 (for example). Before the start of the second decentralized machine process 12, the corresponding completion signals 34 must then be received from further decentralized control units (not shown in FIG. 2 and in FIG. 5).

The central control unit 1 monitors the process execution by means of the start and the end of the respective machine processes being communicated from the decentralized control units 2 and 3 to the central control unit 1. The central control unit 1 compares the process execution to a stored flow chart and starts an error routine as soon as an error occurs (for example, an end message that has not been received within a predetermined time span or a an expected completion signal that has not been received). For example, a component may be thrown away by the suction pipette in the framework of an error routine and a new component picked up.

As a result of the inventive method, only one central control unit 1 is employed to implement control as well as communication tasks without a loss of time occurring between individual machine processes. Only one standard operating system is employed in this single central control unit 1, in contrast to individual computer solutions that provide specifically dedicated computers for control and communication tasks respectively.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for controlling a plurality of successive decentralized machine processes, comprising the steps of:
   providing a cental control unit;
   providing a plurality of decentralized control units including at least a first decentralized control unit and a second decentralized control unit;
   providing respective first communication paths between said central control unit and each of said first decentralized control unit and said second decentralized control unit, and providing a second communication path between said first decentralized control unit and said second decentralized control unit;

controlling a first decentralized machine process with said first decentralized control unit and controlling a second decentralized machine process with said second decentralized control unit;

transmitting a start command via said first communication path from said central control unit to said first decentralized control unit for starting said first decentralized machine process;

said first decentralized control unit starting said first decentralized machine process in response to said start command and transmitting a start signal via said communication path to said central control unit;

during execution of said first decentralized machine process, transmitting a preparatory command via said communication path from said central control unit to said second decentralized control unit and including in said preparatory command at least one start condition for said second decentralized machine process;

upon completion of said first decentralized machine process, transmitting a completion signal directly from said first decentralized control unit to said second decentralized control unit via said second communication path, said completion signal satisfying said start condition for said second decentralized machine process; and said second decentralized control unit starting said second decentralized machine process upon reception of said completion signal.

2. A method as claimed in claim 1 comprising transmitting said preparatory command from said central control unit to said second control unit including a plurality of start conditions for said second decentralized machine process, providing a plurality of further communication paths from said second decentralized control unit respectively to further decentralize control units in said plurality of decentralized control units, each of said further decentralized control units controlling further decentralized machine processes and, upon completion of the respective further machine processes, said further decentralized control units each transmitting a completion signal to said second decentralized control unit via said respective further communication paths, and said second control unit starting said second decentralized machine process only upon reception of all completion signals respectively satisfying said plurality of start conditions.

3. A method as claimed in claim 1 comprising storing a flowchart for said plurality of decentralized machine processes in said central control unit, each of said decentralized control units transmitting a completion signal to said central control unit upon completion of the decentralized machine process controlled by that decentralized control unit, logging said decentralized machine processes in said central control unit upon reception by said central control unit of the respective completion signals, and initiating an error routine upon a deviation between the flowchart stored in said central control unit and a sequence of said decentralized machine processes derived from said start signal and said completion signals.

4. A method as claimed in claim 1 comprising the step of providing a bus comprising said first communication paths and said second communication path.

* * * * *